United States Patent [19]

Tanaka

[11] Patent Number: 5,109,395
[45] Date of Patent: Apr. 28, 1992

[54] DECIMETOR CIRCUIT OF SIMPLE CONSTRUCTION AND HIGH SPEED OPERATION

[75] Inventor: Shigenobu Tanaka, Tokyo, Japan
[73] Assignee: NEC Corporation, Tokyo, Japan
[21] Appl. No.: 641,153
[22] Filed: Jan. 14, 1991
[30] Foreign Application Priority Data Jan. 12, 1990 [JP] Japan .................................... 2-5086

[51] Int. Cl.$^5$ ............................................. H03K 21/10
[52] U.S. Cl. ........................................ 377/44; 377/49; 377/56
[58] Field of Search ................. 377/44, 55, 56, 49, 377/52, 54, 26

[56] References Cited

U.S. PATENT DOCUMENTS

| | | | |
|---|---|---|---|
| 4,199,719 | 4/1980 | Grob | 377/44 |
| 4,741,002 | 4/1988 | Dougherty | 377/49 |
| 4,809,221 | 2/1989 | Magliocco et al. | 377/52 |

Primary Examiner—John S. Heyman
Attorney, Agent, or Firm—Whitham & Marhoefer

[57] ABSTRACT

A decimetor circuit is constructed to execute an FIR filtering of "n" taps for input data sampled with a sampling frequency "f" and then to resample an output of the FIR filter at a frequency of "f/m". A first counter of a "divided-by-n/m" type is driven with a clock having a frequency of "n/m" of the sampling frequency "f" and selectively operates either in a first counting condition in which the first counter is incremented by one count with each clock pulse of the clock or in a second counting condition in which the first counter is incremented by two counts with each clock pulse of the clock. A second counter of a "divided-by-n" type is driven with the clock and incremented by one count with each clock pulse of the clock. A first decoder is coupled to the second counter for decoding a content of the second counter so as to bring the first counter either into the first counting condition or into the second counting condition. An address generation circuit is connected to the first and second counters for generating an address obtained by adding a "m/n" of the content of the second counter with "m" times of a content of the first counter. A coefficient memory receives the address for outputting a coefficient designated by the received address, and a multiplier multiplies the input data by the received coefficient. An adder circuit has a first input connected to receive the result of multiplication, and a second input connected to a "n/m"-stage shift register which receives an output of the adder circuit and is shifted by the clock so as to output a shifted data from a final stage of the "n/m"-stage shift register. A latch circuit periodically latch the output of the adder circuit.

6 Claims, 2 Drawing Sheets

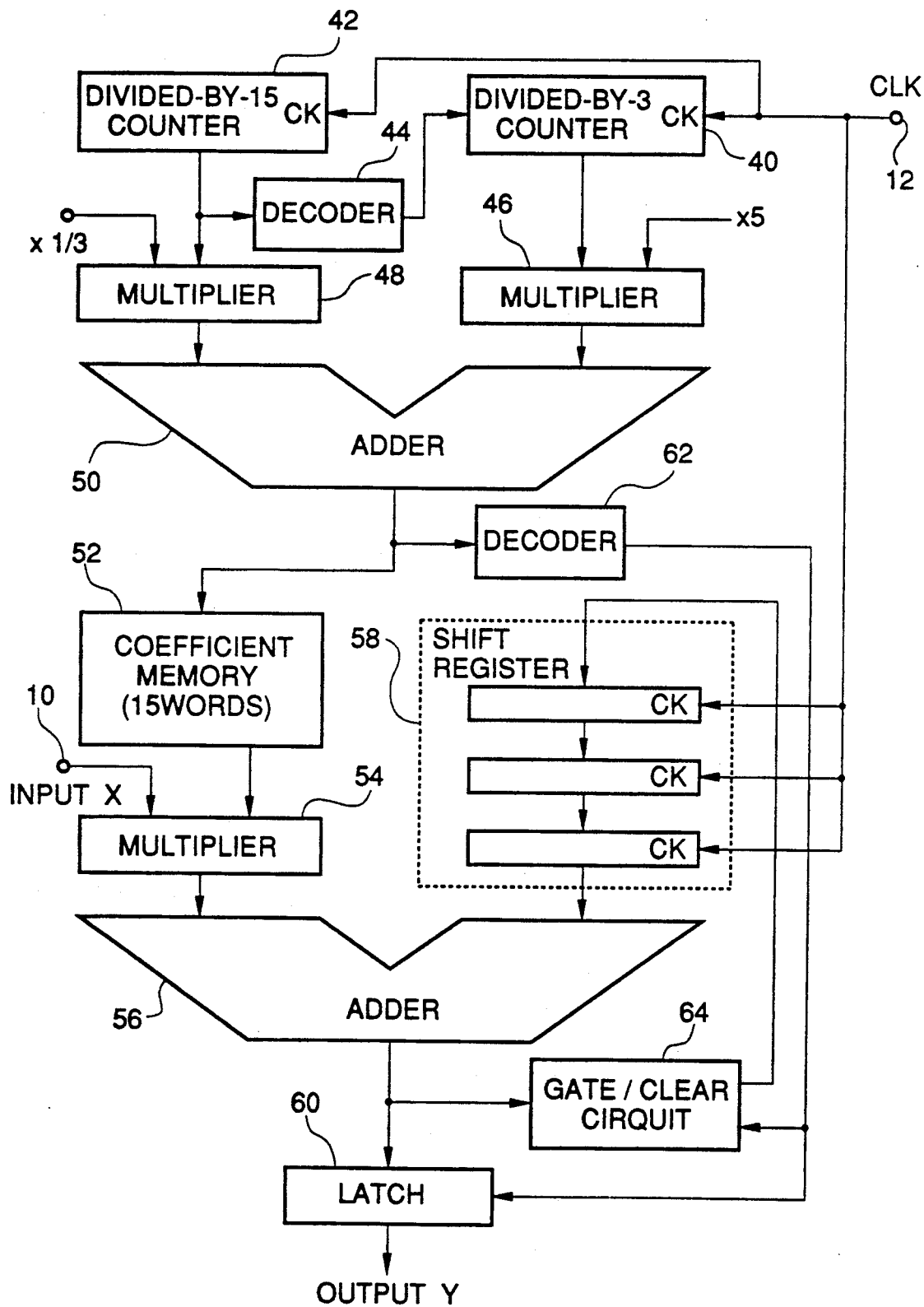

DECIMETOR CIRCUIT OF SIMPLE CONSTRUCTION AND HIGH SPEED OPERATION

BACKGROUND OF THE INVENTION

1. Field of the Invention

The present invention relates to a decimetor circuit composed of an FIR (finite impulse response) digital filter of a down-sampling type.

2. Description of Related Art

An A/D converter (analog-to-digital converter) typified by a $\Delta\Sigma$ type A/D converter configured to sample an analog input signal at a high speed and to convert it into digital data, incorporates therein a decimetor for converting digital data obtained by the high speed sampling, into digital data of a desired sampling frequency. For example, one typical decimetor circuit has a function of converting digital data obtained with a sampling frequency "f" into a digital signal of a sampling frequency "f/4", by thinning out or pruning the digital data of the sampling frequency "f" with a rate of "1-out-of-4". For this purpose, the decimetor circuit includes an FIR filter circuit of 16 taps in order to prevent generation of an aliasing noise caused by the thinning-out, and a latch circuit for latching an output of the FIR filter with the frequency of "f/4". Specifically, the FIR filter circuit comprises an input terminal for receiving input data X obtained with the sampling frequency "f", and a 15-stage shift register having a first stage input connected to the input terminal and driven with a clock of the sampling frequency "f". The input terminal and an output of respective stages of the 15-stage shift register are connected to one input of sixteen multipliers, respectively. A 16-word filter coefficient memory storing 16 filter coefficients is provided to supply the 16 coefficients to the other input of the sixteen multipliers, respectively, so that the input data X and the outputs of the respective stages of the 15-stage shift register are multiplied by the 16 filter coefficients, respectively. Outputs of the sixteen multipliers are supplied to an adder so that all the outputs of the sixteen multipliers are totalized by the adder. An output of the adder is supplied to the above mentioned latch circuit, and latched by the latch circuit at a rate of "1-out-of-4", namely at a clock of the sampling frequency "f/4". An output of the latch circuit is connected to an output terminal for supplying output data Y.

In the above mentioned decimetor circuit, data transition of the input data X, the output of the adder and the output data Y is as shown in the following TABLE:

TABLE 1

| INPUT DATA | ADDER OUTPUT | OUTPUT DATA |
|---|---|---|
| $x(t)$ | $c(15) \cdot x(t) + \ldots + c(0) \cdot x(t-15)$ | |
| $x(t+1)$ | $c(15) \cdot x(t+1) + \ldots + c(0) \cdot x(t-14)$ | |
| . | . | |
| . | . | |
| $x(t+3)$ | $c(15) \cdot x(t+3) + \ldots + c(0) \cdot x(t-12)$ | $c(15) \cdot x(t+3) + \ldots + c(0) \cdot x(t-12)$ |
| . | . | |
| . | . | |
| $x(t+7)$ | $c(15) \cdot x(t+7) + \ldots + c(0) \cdot x(t-8)$ | $c(15) \cdot x(t+7) + \ldots + c(0) \cdot x(t-8)$ |
| . | . | |
| . | . | |
| $x(t+11)$ | $c(15) \cdot x(t+11) + \ldots + c(0) \cdot x(t-4)$ | $c(15) \cdot x(t+11) + \ldots + c(0) \cdot x(t-4)$ |
| . | . | |
| . | . | |
| $x(t+15)$ | $c(15) \cdot x(t+15) + \ldots + c(0) \cdot x(t)$ | $c(15) \cdot x(t+15) + \ldots + c(0) \cdot x(t)$ |
| . | . | |
| . | . | |

As seen from the above TABLE 1, assuming that the input data X at a time "t" is $x(t)$, the 15-stage shift register holds the data which was supplied through the input terminal and the amount of which corresponds to 15 clocks. Therefore, the input data and the output of the respective stages of the shift register can be expressed by $x(t), x(t-1), \ldots x(t-15)$. On the other hand, if the 16 filter coefficients stored in the filter coefficient memory are expressed by $c(15), c(14), \ldots c(0)$, the input and shifted data $x(t), x(t-1), \ldots x(t-15)$ are multiplied by the coefficients $c(15), c(14), \ldots c(0)$, respectively, by means of the sixteen multipliers, and totalized by the adder. Accordingly, the adder outputs data can be expressed by $c(15) \cdot x(t) + c(14) \cdot x(t-1) + \ldots + c(0) \cdot x(t-15)$, as shown in the TABLE 1. The output data of the adder is latched by the latch circuit at the clock of the frequency "f/4".

The above mentioned conventional decimetor circuit has been required either to include sixteen multipliers and an adder capable of adding 16 items of data at once, or to include a multiplier and an adder which can execute an arithmetic operation at a speed which is 16 times as high as the sampling frequency "f" and a coefficient memory which can be accessed at a speed which is 16 times as high as the sampling frequency "f". In addition, a 15-stage shift register has also been required. As a result, the conventional decimetor circuit has been very large in size and has required to operate a high speed operation.

SUMMARY OF THE INVENTION

Accordingly, it is an object of the present invention to provide a decimetor circuit which has overcome the above mentioned defect of the conventional one.

Another object of the present invention is to provide a decimetor circuit having a simple construction and capable of operating at a high speed.

Still another object of the present invention is to provide a decimetor circuit having a pair of counters for generating an address for a coefficient memory and configured to omit arithmetic operation for data which is not outputted as the result of the thinning-out processing.

The above and other objects of the present invention are achieved in accordance with the present invention by a decimetor circuit having an FIR filter having "n" taps for processing input data sampled with a sampling frequency "f" and configured to re-sample an output of the FIR filter at a frequency of "f/m", where "n" and "m" are positive integer greater than 1, comprising a first counter of a "divided-by-n/m" type driven with a clock having a frequency of "n/m" of the sampling frequency "f" and selectively operating either in a first counting condition in which the first counter is incremented by one count with each clock pulse of the clock or in a second counting condition in which the first counter is incremented by two counts with each clock pulse of the clock, a second counter of a "divided-by-n" type driven with the clock and incremented by one count with each clock pulse of the clock, a first decoder coupled to the second counter for decoding a content of the second counter and for controlling the first counter on the basis of the content of the second counter, so as to bring the first counter either into the first counting condition or into the second counting condition, an address generation circuit connected to the first and second counters for generating an address obtained by adding a "m/n" of the content of the second counter with "m" times of a content of the first counter, a coefficient memory storing a predetermined number "n" of filter coefficients and receiving the address for outputting a coefficient designated by the received address, a multiplier receiving the input data and the coefficient outputted from the coefficient memory, for multiplying the input data by the received coefficient, and adder circuit having a first input connected to receive the result of multiplication outputted from the multiplier, a second decoder coupled to receive the address generated by the address generator, for generating a control signal, a gate and clear circuit receiving an output of the adder circuit and controlled by the control signal so as either to output the output of the adder circuit without modification and or to output clearing data, a "n/m"-stage shift register receiving an output of the gate and clear circuit and shifted by the clock so as to output an shifted data from a final stage of the "n/m"-stage shift register to another input of the adder circuit, and a latch circuit coupled to an output of the adder circuit and controlled by the control signal so as to latch the output of the adder circuit.

The above and other objects, features and advantages of the present invention will be apparent from the following description of preferred embodiments of the invention with reference to the accompanying drawings.

BRIEF DESCRIPTION OF THE DRAWINGS

FIG. 2 is a block diagram of a second embodiment of the decimetor in accordance with the present invention.

DESCRIPTION OF THE PREFERRED EMBODIMENTS

Figure 1:
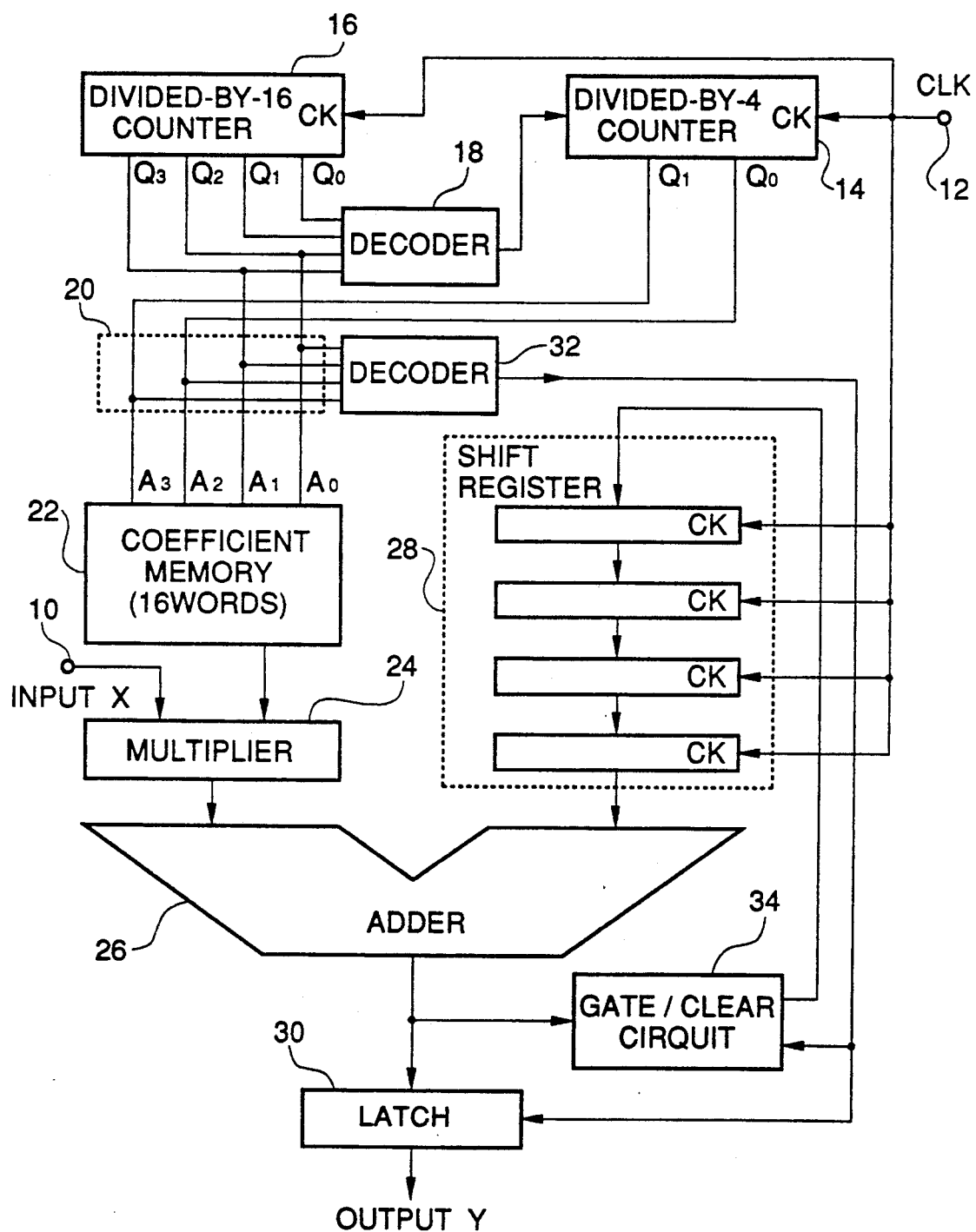
FIG. 1 is a block diagram of a first embodiment of the decimetor in accordance with the present invention.

Referring to FIG. 1, there is shown a block diagram of a first embodiment of the decimetor in accordance with the present invention. The shown embodiment is configured so that, digital data obtained with a sampling frequency "f" is supplied to an FIR filter having 16 (="n") taps and an output of the FIR filter is thinned out with a rate of "1-out-of 4" (4="m").

The shown embodiment includes an input terminal 10 for receiving the input data X obtained with the sampling frequency "f" and a clock terminal 12 for receiving a clock CLK having a frequency which is four times the sampling frequency "f", namely "n/m" times of the sampling frequency "f". The clock terminal 12 is connected to an clock input CK of a "divided-by-4" counter (namely, "divided-by-n/m" counter) 14, which is composed of a two-bit counter. This counter 14 is configured to be switched between a first counting condition in which the counter 14 is incremented from a less significant bit, namely by one count, with each clock pulse of the clock CLK, and a second counting condition in which th counter 14 is incremented from a more significant bit, namely by two counts, with each clock pulse of the clock CLK. The clock terminal 12 is also connected to an clock input CK of a "divided-by-16" counter (namely, "divided-by-n" counter) 16, which is composed of a 4-bit counter configured to be sequentially incremented, one count by one count, with each clock pulse of the clock CLK.

Outputs $Q_0$, $Q_1$, $Q_2$ and $Q_3$ of respective stages of the counter 16 are connected to a decoder 18, which in turn generates, on the basis of a content of the counter 16, a control signal for the counter 14. When the count value of the counter 16 is "15", the decoder 18 generates a control signal to the counter 14 so as to bring the counter 14 into the second counting condition. On the other hand, when the count value of the counter 16 is "0" to "14", the decoder 18 maintains the counter 14 in the first counting condition.

The counter 14 and the counter 16 are coupled to an address generator 20, which in turn generates an address $A_0$, $A_1$, $A_2$ and $A_3$ for a filter coefficient memory 22 of 16 (="n") words. This address generator 20 is configured to output, as the address, a value obtained by adding one fourth ("m/n" times) of the output value of the counter 16 and four times ("m" times) of the output value of the counter 14. In the shown embodiment, for this purpose, the address generator 20 is constituted of a wiring which makes it possible to supply the outputs $Q_2$ and $Q_3$ of two more significant bit stages of the counter 16 as two less significant bits of the address and also to supply the outputs $Q_0$ and $Q_1$ of respective stages of the counter 14 as two more significant bits of the address.

The coefficient memory 22 stores filter coefficients of 16 (="n") words c(0) to c(15), and outputs one selected filter coefficient designated by the address generated by the address generator 20, to one input of a multiplier 24. The other input of the multiplier 24 is connected to the input terminal 10 so as to receive the input data X. An output of the multiplier 24 is connected to one input of an adder circuit 26, which in turn has the other input connected to an output of a shift register 28. An output of the adder circuit 26 is connected to a latch circuit 30 for outputting a latched data as an output Y.

The address $A_0$, $A_1$, $A_2$ and $A_3$ generated by the address generator 20 is also connected to another decoder 32. When the address $A_0$, $A_1$, $A_2$ and $A_3$ indicates "15", the decoder 32 generates a control signal of "0" to the latch circuit 30, so as to cause the latch circuit 30 to latch the output of the adder circuit 26. On the other hand, when the address $A_0$, $A_1$, $A_2$ and $A_3$ indicates a value other than "15", the decoder 32 generates the control signal of "1" so as to inhibit the latch circuit 30 from latching the output of the adder circuit 26.

The output of the adder circuit 26 is also connected to a gate and clear circuit 34, which in turn has an output connected to an input of the shift register 28. This gate and clear circuit 34 is controlled by the control signal generated by the decoder 32 in such a manner that when the control signal generated by the decoder 32 is of "0", namely, when the address $A_0$, $A_1$, $A_2$ and $A_3$ indicates "15", the gate and clear circuit 34 outputs the output of the adder circuit 26 to the shift register 28 without modification.

The shift register 28 is composed of four (="n/m") stages of multi-bit registers, each of which is driven by the clock CLK supplied through the clock input 12, so that a content of each stage is shifted to a next stage in parallel.

The following TABLE 2 shows data transition of the input data X, the output of the "divided-by-4" counter 14, the output of the "divided-by-16" counter 16, the coefficient memory address generated by the address generator 20, the output of the adder circuit 26, and the output data Y.

TABLE 2

| INPUT DATA | DIVIDED-BY-4 COUNTER OUTPUT | DIVIDED-BY-16 COUNTER OUTPUT | COEFFICIENT MEMORY ADDRESS | ADDER OUTPUT DATA | OUTPUT SIGNAL LINE OUTPUT DATA "Y" |
|---|---|---|---|---|---|
| $x(t)$ | 00 | 00 | 00 | $c(0) \cdot x(t)$ | |
| | 01 | 01 | 04 | $c(4) \cdot x(t) + \ldots + c(0) \cdot x(t-4)$ | |
| | 02 | 02 | 08 | $c(8) \cdot x(t) + \ldots + c(0) \cdot x(t-8)$ | |
| | 03 | 03 | 12 | $c(12) \cdot x(t) + \ldots + c(0) \cdot x(t-12)$ | |
| $x(t+1)$ | 00 | 04 | 01 | $c(1) \cdot x(t+1) + c(0) \cdot x(t)$ | |
| | 01 | 05 | 05 | $c(5) \cdot x(t+1) + \ldots + c(0) \cdot x(t-4)$ | |
| | 02 | 06 | 09 | $c(9) \cdot x(t+1) + \ldots + c(0) \cdot x(t-8)$ | |
| | 03 | 07 | 13 | $c(13) \cdot x(t+1) + \ldots + c(0) \cdot x(t-12)$ | |
| . | . | . | . | . | |
| $x(t+3)$ | 00 | 12 | 03 | $c(3) \cdot x(t+3) + \ldots + c(0) \cdot x(t)$ | |
| | 01 | 13 | 07 | $c(7) \cdot x(t+3) + \ldots + c(0) \cdot x(t-4)$ | |
| | 02 | 14 | 11 | $c(11) \cdot x(t+3) + \ldots + c(0) \cdot x(t-8)$ | |
| | 03 | 15 | 15 | $c(15) \cdot x(t+3) + \ldots + c(0) \cdot x(t-12)$ | $c(15) \cdot x(t+3) + \ldots + c(0) \cdot x(t-12)$ |
| $x(t+4)$ | 01 | 00 | 04 | $c(4) \cdot x(t+4) + \ldots + c(0) \cdot x(t)$ | |
| | 02 | 01 | 08 | $c(8) \cdot x(t+4) + \ldots + c(0) \cdot x(t-4)$ | |
| | 03 | 02 | 12 | $c(12) \cdot x(t+4) + \ldots + c(0) \cdot x(t-8)$ | |
| | 00 | 03 | 00 | $c(0) \cdot x(t+4)$ | |
| . | . | . | . | . | |
| $x(t+7)$ | 01 | 12 | 07 | $c(7) \cdot x(t+7) + \ldots + c(0) \cdot x(t)$ | |
| | 02 | 13 | 11 | $c(11) \cdot x(t+7) + \ldots + c(0) \cdot x(t-4)$ | |
| | 03 | 14 | 15 | $c(15) \cdot x(t+7) + \ldots + c(0) \cdot x(t-8)$ | |
| | 00 | 15 | 03 | $c(3) \cdot x(t+7) + \ldots + c(0) \cdot x(t+4)$ | $c(15) \cdot x(t+7) + \ldots + c(0) \cdot x(t-8)$ |
| . | . | . | . | . | |
| $x(t+11)$ | 02 | 12 | 11 | $c(11) \cdot x(t+11) + \ldots + c(0) \cdot x(t)$ | |
| | 03 | 13 | 15 | $c(15) \cdot x(t+11) + \ldots + c(0) \cdot x(t-4)$ | |
| | 00 | 14 | 03 | $c(7) \cdot x(t+11) + \ldots + c(0) \cdot x(t+8)$ | |
| | 01 | 15 | 07 | $c(3) \cdot x(t+11) + \ldots + c(0) \cdot x(t+4)$ | $c(15) \cdot x(t+11) + \ldots + c(0) \cdot x(t-4)$ |
| . | . | . | . | . | |
| $x(t+15)$ | 03 | 12 | 15 | $c(15) \cdot x(t+15) + \ldots + c(0) \cdot x(t)$ | $c(15) \cdot x(t+15) + \ldots + c(0) \cdot x(t)$ |
| | 00 | 13 | 03 | $c(3) \cdot x(t+15) + \ldots + c(0) \cdot x(t+12)$ | |
| | 01 | 14 | 07 | $c(7) \cdot x(t+15) + \ldots + c(0) \cdot x(t+8)$ | |
| | 02 | 15 | 11 | $c(11) \cdot x(t+15) + \ldots + c(0) \cdot x(t+4)$ | | namely, when the address $A_0$, $A_1$, $A_2$ and $A_3$ indicates "15", the gate and clear circuit 34 outputs data of all "0" to the shift register 28. When the control signal generated by the decoder 32 is of "1", namely, when the address $A_0$, $A_1$, $A_2$ and $A_3$ indicates a value other than As seen from the above TABLE 2, the counters 14 and 16 are normally incremented, one count by one count, with each clock pulse of the clock CLK having the frequency which is four times the sampling frequency "f". However, when the content of the counter 16 becomes "15", it is decoded by the decoder 18 and the counter 14 is brought into the second condition so that the more significant bit of the counter 14 is incremented by one clock pulse of the clock CLK. Namely, the content of the counter 14 is offset or deviated by the amount corresponding to one count. Since the coefficient memory address has the two more significant bits composed of the two-bit output of the counter 14 and the two less significant bits composed of the two more significant bits of the output of the counter 16, the outputs of the counters 14 and 16 and the coefficient memory address change as shown in the TABLE 2. On the other hand, the input data X changes with the sampling frequency "f". Therefore, four memory addresses which are separated at equal intervals of "4", are designated for each one input data X supplied through the input terminal 10. These memory addresses are incremented with every sampling period of the input data X in a rang of "0" to "15", maintaining the equal intervals of "4".

The filter coefficient memory 22 receiving the address designated in the above mentioned manner supplies the filter coefficients one by one in accordance with the designated address. The filter coefficient outputted from the memory 22 is multiplied with the input data X by means of the multiplier 24, and added with the output of the shift register 28 by means of the adder circuit 26.

As mentioned hereinbefore, since the shift register 28 is the four-stage shift register shifted by each clock pulse of the clock CLK, results of product and sum of the input data X and the respective filter coefficients c(0) to c(15) read our of the memory 22 are held in the shift register 28. The result of the product and sum is latched in the latch circuit 30 under control of the decoder 32 when the efficient memory address becomes "15" and the adder circuit 26 has executed addition of the input data X and the filter coefficient c(15). At the same time, the data of all "0" is supplied from the gate and clear circuit 34 to the shift register 28. Again, the results of product and sum of the input data X and the respective filter coefficients c(0) to c(15) are held in the shift register 28.

Thus, an output of the 16-tap FIR filter can be obtained from the output Y at a rate of "one out of four items of sample data".

Referring to FIG. 2, there is shown a block diagram of a second embodiment of the decimetor in accordance with the present invention. The second embodiment is configured so that, digital data obtained with a sampling frequency "f" is processed an FIR filter having 15 (="n") taps and an output of the FIR filter is thinned out with a rate of "1-out-of 5" (5="m"). Therefore, the second embodiment is driven with a clock having a frequency which is three times (="n/m") of the sampling frequency "f".

The second embodiment includes an input terminal 10 for receiving input data X obtained with the sampling frequency "f" and a clock terminal 12 for receiving a clock having a frequency which is three times the sampling frequency "f", namely "n/m" times of the sampling frequency "f". The clock terminal 12 is connected to an clock input CK of a "divided-by-3" (namely, "divided-by-n/m" counter) 40. This counter 40 is configured to be switched between a first counting condition in which the counter 40 is incremented, one count by one count, with each clock pulse of the clock CLK, and a second counting condition in which the counter 40 is incremented, two counts by two counts, with each clock pulse of the clock CLK. The clock terminal 12 is also connected to an clock input CK of a "divided-by-15" counter (namely, "divided-by-n" counter) 42, which is configured to be sequentially incremented, one count by one count, with each clock pulse of the clock CLK.

An output of the counter 42 are connected to a decoder 44, which in turn generates on the basis of a content of the counter 42 a control signal for the counter 40. When the count value of the counter 42 is "14", the decoder 44 generates a control signal to the counter 40 so as to bring the counter 40 into the second counting condition. On the other hand, when the count value of the counter 42 is "0" to "13", the decoder 44 maintains the counter 40 in the first counting condition.

An output of the counter 40 is connected to one input of a multiplier 46 for multiplication by "5" (="m"). For this purpose, the multiplier has the other input connected to receive a constant "5". On the other hand, an output of of the counter 42 is connected to one input of a multiplier 48 for multiplication by "⅓" (="m/n"). For this purpose, the multiplier 48 has the other input connected to receive a constant "⅓". Outputs of the two multipliers 46 and 48 are connected to two inputs of an adder circuit 50, respectively. This adder circuit 50 outputs the result of addition as an address for a filter coefficient memory 52.

The coefficient memory 52 stores filter coefficients of 15 (="n") words c(0) to c(14), and outputs one selected filter coefficient designated by the address outputted by the addition circuit 50, to one input of a multiplier 54. The other input of the multiplier 54 is connected to the input terminal 10 so as to receive the input data X. An output of the multiplier 24 is connected to one input of an adder circuit 56, which in turn has the other input connected to an output of a shift register 58. An output of the adder circuit 56 is connected to a latch circuit 60 for outputting a latched data as an output Y.

The address outputted by the adder circuit 50 is also connected to another decoder 62. When the address outputted by the adder circuit 50 indicates "14", the decoder 62 generates a control signal of "0" to the latch circuit 60, so as to cause the latch circuit 60 to latch the output of the adder circuit 56. On the other hand, when the address outputted by the adder circuit 50 indicates a value other than "14", the decoder 62 generates the control signal of "1" so as to inhibit the latch circuit 60 from latching the output of the adder circuit 56.

The output of the adder circuit 56 is also connected to a gate and clear circuit 64, which in turn has an output connected to an input of the shift register 58. This gate and clear circuit 64 is controlled by the control signal generated by the decoder 62 in such a manner that when the control signal generated by the decoder 62 is of "0", namely, when the address outputted by the adder circuit 50 indicates "14", the gate and clear circuit 64 outputs data of all "0" to the shift register 58. When the control signal generated by the decoder 62 is of "1", namely, when the address outputted by the adder circuit 50 indicates a value other than "14", the gate and clear circuit 64 outputs the output of the adder circuit 56 to the shift register 58 without modification.

The shift register 58 is composed three (="n/m") stages of multi-bit registers, each of which is driven by the clock supplied through the clock input 12, so that a content of each stage is shifted to a next stage in parallel.

The following TABLE 3 shows data transition of the input data X, the output of the divided-by-15 counter 40, the output of the divided-by-3 counter 42, the coefficient memory address generated by the adder circuit 50, the output of the adder circuit 56, and the output data Y.

Since the coefficient memory address is composed of the sum of the five times the output of the counter 40 and the one third of the output of the counter 42, the outputs of the counters 40 and 42 and the output of the adder circuit 50 (namely, the coefficient memory address) change as shown in the TABLE 3. On the other hand, the input data X changes with the sampling frequency "f". Therefore, three memory addresses which

TABLE 3

| INPUT DATA | DIVIDED-BY-3 COUNTER OUTPUT | DIVIDED-BY-15 COUNTER OUTPUT | COEFFICIENT MEMORY ADDRESS | ADDER OUTPUT DATA | OUTPUT SIGNAL LINE OUTPUT DATA "Y" |
|---|---|---|---|---|---|
| $x(t)$ | 00 | 00 | 00 | $c(0) \cdot x(t)$ | |
| | 01 | 01 | 05 | $c(5) \cdot x(t) + \ldots + c(0) \cdot x(t-5)$ | |
| | 02 | 02 | 10 | $c(12) \cdot x(t) + \ldots + c(0) \cdot x(t-10)$ | |
| $x(t+1)$ | 00 | 03 | 01 | $c(1) \cdot x(t+1) + c(0) \cdot x(t)$ | |
| | 01 | 04 | 06 | $c(6) \cdot x(t+1) + \ldots + c(0) \cdot x(t-5)$ | |
| | 02 | 05 | 11 | $c(11) \cdot x(t+1) + \ldots + c(0) \cdot x(t-10)$ | |
| . | . | . | . | . | |
| . | . | . | . | . | |
| . | . | . | . | . | |
| $x(t+4)$ | 00 | 12 | 04 | $c(4) \cdot x(t+4) + \ldots + c(0) \cdot x(t)$ | |
| | 01 | 13 | 09 | $c(9) \cdot x(t+4) + \ldots + c(0) \cdot x(t-5)$ | |
| | 02 | 14 | 14 | $c(14) \cdot x(t+4) + \ldots + c(0) \cdot x(t-10)$ | $c(14) \cdot x(t+4) + \ldots + c(0) \cdot x(t-10)$ |
| $x(t+5)$ | 01 | 00 | 05 | $c(5) \cdot x(t+5) + \ldots + c(0) \cdot x(t)$ | |
| | 02 | 01 | 10 | $c(10) \cdot x(t+5) + \ldots + c(0) \cdot x(t-5)$ | |
| | 00 | 02 | 00 | $c(0) \cdot x(t+5)$ | |
| . | . | . | . | . | |
| . | . | . | . | . | |
| . | . | . | . | . | |
| $x(t+9)$ | 01 | 12 | 09 | $c(9) \cdot x(t+9) + \ldots + c(0) \cdot x(t)$ | |
| | 02 | 13 | 14 | $c(14) \cdot x(t+9) + \ldots + c(0) \cdot x(t-5)$ | $c(14) \cdot x(t+9) + \ldots + c(0) \cdot x(t-5)$ |
| | 00 | 14 | 04 | $c(4) \cdot x(t+9) + \ldots + c(0) \cdot x(t+5)$ | |
| . | . | . | . | . | |
| . | . | . | . | . | |
| . | . | . | . | . | |
| $x(t+14)$ | 02 | 12 | 14 | $c(14) \cdot x(t+14) + \ldots + c(0) \cdot x(t)$ | $c(14) \cdot x(t+14) + \ldots + c(0) \cdot x(t)$ |
| | 00 | 13 | 04 | $c(4) \cdot x(t+14) + \ldots + c(0) \cdot x(t+10)$ | |
| | 01 | 14 | 09 | $c(9) \cdot x(t+14) + \ldots + c(0) \cdot x(t+5)$ | |
| . | . | . | . | . | |
| . | . | . | . | . | |
| . | . | . | . | . | |
| $x(t+19)$ | 00 | 12 | 04 | $c(4) \cdot x(t+19) + \ldots + c(0) \cdot x(t+15)$ | |
| | 01 | 13 | 09 | $c(9) \cdot x(t+19) + \ldots + c(0) \cdot x(t+10)$ | |
| | 02 | 14 | 14 | $c(14) \cdot x(t+19) + \ldots + c(0) \cdot x(t+5)$ | $c(14) \cdot x(t+19) + \ldots + c(0) \cdot x(t+5)$ |
| . | . | . | . | . | |
| . | . | . | . | . | |
| . | . | . | . | . | |

The second embodiment constitutes a decimetor circuit for performing a 15-tap FIR filtering and a thinning-out of a 1-out-of-5. The second embodiment is characterized in that a coefficient memory address is generated by cooperation of two multipliers and one adder.

The counters 40 and 42 are normally incremented, one count by one count, with each clock pulse of the clock CLK having the frequency which is three times the sampling frequency "f". However, when the content of the counter 42 becomes "14", it is decoded by the decoder 44 and the counter 42 is controlled by the decoder 44 so that the counter 14 is incremented by two counts with one clock pulse of the clock CLK. Namely, the content of the counter 40 is offset or deviated by the amount corresponding to one count.

are separated at equal intervals of "5", are designated for each one input data X supplied through the input terminal 10. These memory addresses are incremented with every sampling period of the input data X in a rang of "0" to "14", maintaining the equal intervals of "5".

The filter coefficient, one by one, outputted from The filter coefficient memory 52 receiving the address designated in accordance with the above mentioned manner, is multiplied with the input data X by means of the multiplier 54, and added with the output of the shift register 58 by means of the adder circuit 56.

As mentioned hereinbefore, since the shift register 58 is the three-stage shift register shifted by each clock pulse of the clock CLK, results of product and sum of the input data X and the respective filter coefficients c(0) to c(14) read out of the memory 52 are held in the shift register 58. The result of the product and sum is latched in the latch circuit 60 under control of the decoder 62 when the efficient memory address becomes "14" and the adder circuit 56 has executed addition of the input data X and the filter coefficient c(14). At the same time, the data of all "0" is supplied from the gate and clear circuit 64 to the shift register 58. Again, the results of product and sum of the input data X and the respective filter coefficients c(0) to c(14) are held in the shift register 58.

Thus, an output of the 15-tap FIR filter can be obtained from the output Y at a rate of "one out of five items of sample data".

As seen from the above, the decimetor in accordance with the present invention is simple in circuit construction, since the size and the amount of the shift register, the addition circuits and the multipliers are reduced. Therefore, the decimetor in accordance with the present invention can operates at a high speed and can be easily assembled in an integrated circuit.

The invention has thus been shown and described with reference to the specific embodiments. However, it should be noted that the present invention is in no way limited to the details of the illustrated structures but changes and modifications may be made within the scope of the appended claims.

I claim:

1. A decimetor circuit having an FIR filter having "n" taps for processing input data sampled with a sampling frequency "f" and configured to re-sample an output of the FIR filter at a frequency of "f/m", where "n" and "m" are positive integer greater than 1, comprising a first counter of a "divided-by-n/m" type driven with a clock having a frequency of "n/m" of the sampling frequency "f" and selectively operating either in a first counting condition in which said first counter is incremented by one count with each clock pulse of said clock or in a second counting condition in which said first counter is incremented by two counts with each clock pulse of said clock, a second counter of a "divided-by-n" type driven with said clock and incremented by one count with each clock pulse of said clock, a first decoder coupled to said second counter for decoding a content of said second counter and for controlling said first counter on the basis of the content of said second counter, so as to bring said first counter either into said first counting condition or into said second counting condition, an address generation circuit connected to said first and second counters for generating an address obtained by adding a "m/n" of the content of said second counter with "m" times of a content of said first counter, a coefficient memory storing a predetermined number "n" of filter coefficients and receiving said address for outputting a coefficient designated by the received address, a multiplier receiving the input data and the coefficient outputted from said coefficient memory, for multiplying the input data by the received coefficient, an adder circuit having a first input connected to receive the result of multiplication outputted from said multiplier, a second decoder coupled to receive said address generated by said address generator, for generating a control signal, a gate and clear circuit receiving an output of said adder circuit and controlled by said control signal so as either to output said output of said adder circuit without modification and or to output clearing data, a "n/m"-stage shift register receiving an output of said gate and clear circuit and shifted by said clock so as to output an shifted data from a final stage of said "n/m"-stage shift register to another input of said adder circuit, and a latch circuit coupled to an output of said adder circuit and controlled by said control signal so as to latch said output of said adder circuit.

2. A decimetor circuit claimed in claim 1 wherein said address generation circuit includes a second multiplier receiving said output of said second counter for multiplying said output of said second counter by "m/n", a third multiplier receiving said output of said first counter for multiplying said output of said second counter by "m", and a second adder circuit receiving and adding an output of said second multiplier and an output of said second multiplier.

3. A decimetor circuit claimed in claim 1 wherein n=16 and m=4, said first counter is composed of a "divided-by-4" counter, and said first counter is composed of a "divided-by-16" counter, and wherein said address generation circuit is composed of a wiring circuit for generating said address of four bits, said wiring circuit receiving an output of the said first counter for outputting the output of the said first counter as two more significant bits of said four-bit address, and receiving two more significant bits of an output of said second counter for outputting the two more significant bits of said output of said second counter as two less significant bits of said four-bit address.

4. A decimetor circuit claimed in claim 1 wherein said first decoder is coupled to receive a content of said second counter for controlling said first counter in such a manner that when said content of said second counter indicates a maximum value, said first decoder forcibly brings said first counter into said second counting condition, and when said content of said second counter indicates a value other than said maximum value, said first decoder maintains said first counter in said first counting condition.

5. A decimetor circuit claimed in claim 1 wherein when said address generated by said address generator indicates a maximum address of said coefficient memory, said second decoder generates a first control signal to said latch circuit and said gate and clear circuit so that said latch circuit latches said output of said adder circuit and said gate and clear circuit outputs data of all "O" to said input of said shift register, and when said address generated by said address generator indicates an address other than said maximum address of said coefficient memory, said second decoder generates a second control signal to said latch circuit and said gate and clear circuit so that said latch circuit is inhibited from latching said output of said adder circuit and said gate and clear circuit outputs said output of said adder circuit to said input of said shift register without modification.

6. A decimetor circuit constructed to execute an FIR filtering of "n" taps for input data sampled with a sampling frequency "f" and then to re-sample an output of the FIR filter at a frequency of "f/m", comprising a first counter of a "divided-by-n/m" type driven with a clock having a frequency of "n/m" of the sampling frequency "f" and selectively operating either in a first counting condition in which the first counter is incremented by one count with each clock pulse of the clock or in a second counting condition in which the first counter is incremented by two counts with each clock pulse of the clock, a second counter of a "divided-by-n" type driven with the clock and incremented by one count with each clock pulse of the clock, a first decoder coupled to the second counter for decoding a content of the second counter so as to bring the first counter either into the first counting condition or into the second counting condition, an address generation circuit connected to the first and second counters for generating an address obtained by adding a "m/n" of the content of the second counter with "m" times of a content of the first counter, a coefficient memory receiving the address for outputting a coefficient designated by the received address, a multiplier receiving the input data and the received coefficient for multiplying the input data by the received coefficient, an adder circuit having a first input connected to receive the result of multiplication, and a second input connected to a "n/m"-stage shift register which receives an output of the adder circuit and is shifted by the clock so as to output an shifted data from a final stage of the "n/m"-stage shift register, and a latch circuit for periodically latching the output of the adder circuit.

* * * * *